(12) United States Patent
Nishio et al.

(10) Patent No.: US 6,643,839 B1
(45) Date of Patent: Nov. 4, 2003

(54) DETERMINING AN OPTIMUM WIRING PATTERN AND COMPONENT PLACEMENT SCHEME FOR A PRINTED WIRING BOARD

(75) Inventors: Toshihiko Nishio, Moriyama (JP); Shinji Nakamura, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 521 days.

(21) Appl. No.: 09/605,616

(22) Filed: Jun. 28, 2000

(30) Foreign Application Priority Data

Jul. 8, 1999 (JP) .......................................... 11-194611

(51) Int. Cl.[7] .............................................. G06F 17/50
(52) U.S. Cl. .............................................. 716/15; 716/8
(58) Field of Search ............................. 716/1–5, 7–15, 716/18

(56) References Cited

U.S. PATENT DOCUMENTS 5,745,371 A * 4/1998 Shouen .......................... 716/15
5,847,968 A * 12/1998 Miura et al. ..................... 716/8
6,496,957 B1 * 12/2002 Kumagai ......................... 716/4

* cited by examiner

*Primary Examiner*—Vuthe Siek
*Assistant Examiner*—Paul Dinh
(74) *Attorney, Agent, or Firm*—William N. Hogg

(57) ABSTRACT

An apparatus for designing a printed wiring board comprises an input section for receiving information necessary to design the board, information on components to be mounted on the board, and information on connection between the components; a storage section for storing the information such as the board information, the component information, the connection information, and the information obtained form printed wiring boards designed in the past; a display section for displaying the input information and various information on designing; and a calculation/control section for performing predetermined calculations by the use of various information stored in the storage section and controlling the input section, the display section, and the storage section, wherein the ratio of a total wirable length to a total wiring length necessary to connect components is determined on the basis of various information stored in the section 38, and a PWB grade of the board is selected based on this ratio. A method of performing these calculations to obtain such results is also provided.

17 Claims, 9 Drawing Sheets

FIG. 5

| PWB GRADE | PTH Via Count | Photo Via Count (FV1/BV1) | Photo Via Count (FV2/BV2) |
|---|---|---|---|
| FR4 | (Signal Count × 1.1) + Power Count | — | — |
| SLC (1+1 on 4S2P) | (Signal Count × 0.5) + Power Count | Signal Count × 0.6 | — |
| SLC (1+1 on 6S2P) | (Signal Count × 0.6) + Power Count | Signal Count × 0.6 | — |
| SLC (2+2 on 2S2P) | (Signal Count × 0.25) + Power Count | Signal Count × 0.5 | Signal Count × 0.5 |
| SLC (2+2 on 4S2P) | (Signal Count × 0.3) + Power Count | Signal Count × 0.5 | Signal Count × 0.5 |

FIG. 6

| The Number of Signal Layers | PWB Grade | Correction Factor |
|---|---|---|
| 6 | FR4 9LPC | 1.08 |
| 8 | FR4 9LPC | 0.98 |
| 10 | FR4 7LPC | 0.95 |

US 6,643,839 B1

DETERMINING AN OPTIMUM WIRING PATTERN AND COMPONENT PLACEMENT SCHEME FOR A PRINTED WIRING BOARD

TECHNICAL FIELD

The present invention relates to a method and an apparatus for designing a printed wiring board, and more particularly to a method and an apparatus for designing a printed wiring board in which the optimum grade of the board can be selected.

BACKGROUND OF THE INVENTION

There are several kinds of printed wiring boards, such as glass cloth epoxy boards and build-up boards, that are distinguished by board formation techniques. Further, among these several kinds of boards, there are several types, such as "4S2P" (4 signal layers and two power layers), and "6S2P" (6 signal layers and 2 power layers), etc. that are distinguished by design criteria (design rules). Depending on the kinds and types of the boards, design rules including conductor width, wiring spacing, spacing between lands and conductors, the configuration of a wiring layer, the size of via holes that establish connections between conductors in different wiring layers, land size, methods of forming lands and via holes, and wiring density may vary. The boards can be graded according to their corresponding wiring densities. A board having a high wiring density is defined as a high-grade board, whereas a board having a low wiring density is defined as a low-grade board. Therefore, a high-grade board has more signal lines per unit area than a low-grade board. A higher-grade board also has a higher degree of flexibility in wiring than a lower-grade board if both are equal in size and the number of wirings, so that wiring patterns can be more easily formed on the higher-grade board in a shorter design time. However, in order to narrow the wiring width and spacing, and to reduce the sizes of via holes and lands, a more precise production technique is required, typically resulting in a corresponding increase in costs to produce such boards.

A grade of a printed wiring board is selected from among several alternatives by a designer thereof based on his/her own experience. Such an empirical selection of the board may often lead to a selection of an unnecessarily higher-grade board or a lower-grade board whose grade is too low to form wiring patterns thereon. Selection of an unnecessarily higher-grade board leads to higher production costs. On the other hand, selection of an unnecessarily lower-grade board renders the formation of wiring patterns impossible, whereby the grade of the board has to be selected again to accommodate such wiring patterns.

OBJECTS AND SUMMARY OF THE INVENTION

An object of the present invention is to determine the ratio of a total length of wiring which can be formed on the board to a total length of wiring which must be formed on the board, and to select an optimum grade of the board based on this ratio. It is another object of this invention to provide an apparatus and method for making a printed wiring board having the selected wiring thereon.

An apparatus for designing a printed wiring board according to the present invention comprises structure for obtaining an actual board area, obtaining an area of the board on which wiring patterns cannot be formed (hereinafter referred to as "unwirable area") and for determining the ratio of a total length of wiring which can be formed on an area obtained by subtracting the unwirable area from the actual board area (hereinafter referred to as wirable area) to a total length of wiring necessary to establish a connection between components.

A method for designing a printed wiring board according to the present invention comprises the steps of obtaining an actual board area, obtaining an unwirable area of the board, and determining the ratio of a total length of wiring which can be formed on a wirable area obtained by subtracting the unwirable area from the actual board area to a total length of wiring necessary to establish a connection between components.

BRIEF DESCRIPTION OF THE DRAWINGS

FIG. 4(b) is a diagram showing an actual area of the board, FIG. 4(c) is a diagram showing a maximum virtual area of the board, and FIG. 4(d) is a diagram showing an effective virtual area of the board.

FIG. 5 is a diagram showing an example of data for estimating a via hole count on the basis of a PWB grade, a signal count, and a power count.

FIG. 6 is a diagram showing data for obtaining a correction factor of the via hole count on the basis of the PWB grade and the number of signal layers.

BEST MODE FOR CARRYING OUT THE INVENTION

Figure 1:
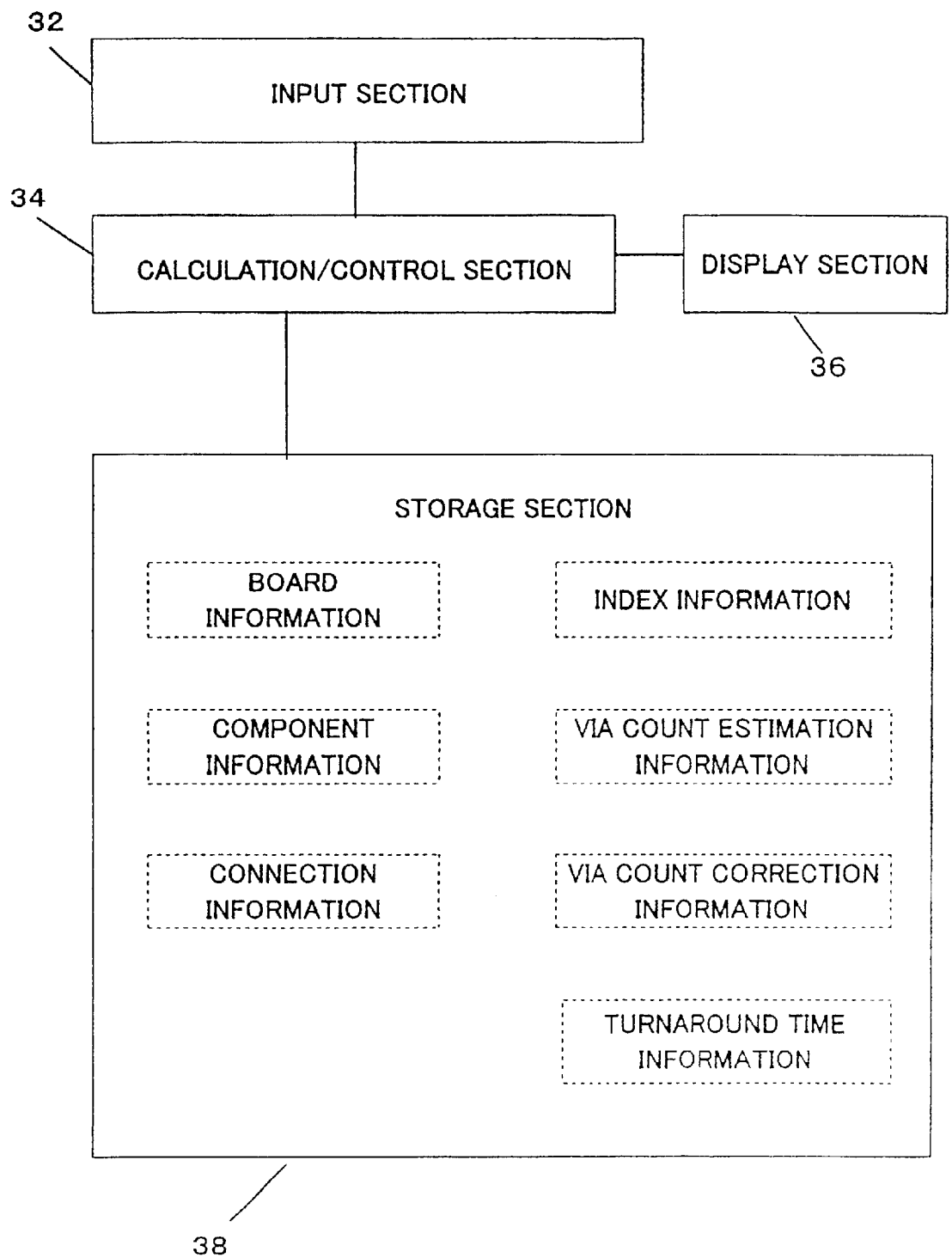
FIG. 1 is a diagram showing an example of the basic structure of the PWB designing apparatus according to the present invention.

Preferred embodiments of the apparatus and the method for designing a printed wiring board (hereinafter referred to as PWB designing apparatus and method) according to the present invention will be described in detail below with reference to the accompanying drawings. FIG. 1 shows a basic structure of the PWB designing apparatus of the present invention. An input section 32 receives information necessary to design the board, such as board information, component information, and connection information. A storage section 38 stores the information which is input through the input section 32. A display section 36 displays the input information and various information on design. A calculation/control section 34 performs predetermined calculations by using various information stored in the storage section 38 and controls the input section 32, the display section 36, and the storage section 38. The PWB designing apparatus of the present invention, which comprises the input section 32, the display section 36, the calculation/control section 34, and the storage section 38, also has functions of a conventional PWB designing apparatus. Further, various information obtained from printed wiring boards designed in the past, such as via count estimation information, via count correction information, and turn-around time information which will be described later is stored in advance in the storage section 38 of the PWB designing apparatus of the present invention. The storage section 38 also stores INDEX information which will be described later.

The board information input through the input section 32 includes such information as sizes, areas, and grades of various boards. Component information includes information such as shape, dimensions, number of terminals, and model numbers of each component, as well as information on the placement of these components. The connection information includes information on the components (terminal patterns and location) and information on signal and power counts. These board, component, and connection information also include such information that may be input into a conventional PWB designing apparatus.

The PWB designing apparatus of the present invention determines the ratio of a total wirable length to a total wiring length of boards of various grades. The term "total wirable length" used herein means a total length of wiring which can be formed on the board, whereas the term "total wiring length" means a total length of wiring which must be formed on the board. As a total wirable length is larger compared with a total wiring length, the board has a higher degree of flexibility in wiring, which makes it easier to form wiring patterns on the board and increases the possibility of realizing the formation of wiring patterns on the board. Conversely, as a total wirable length is smaller compared with a total wiring length, the board has a lower degree of flexibility in wiring, which makes it more difficult to form wiring patterns on the board and lowers the possibility of realizing the formation of wiring patterns. Therefore, by determining the above-mentioned ratio in advance based on printed wiring boards designed in the past, wirability of each board can be determined on the basis of the above-mentioned ratio. This ratio is hereinafter referred to as INDEX. In this embodiment, an INDEX is defined as follows:

$$\text{INDEX} = (\text{total wirable length})/(\text{total wiring length}) \quad (1)$$

Figure 2:
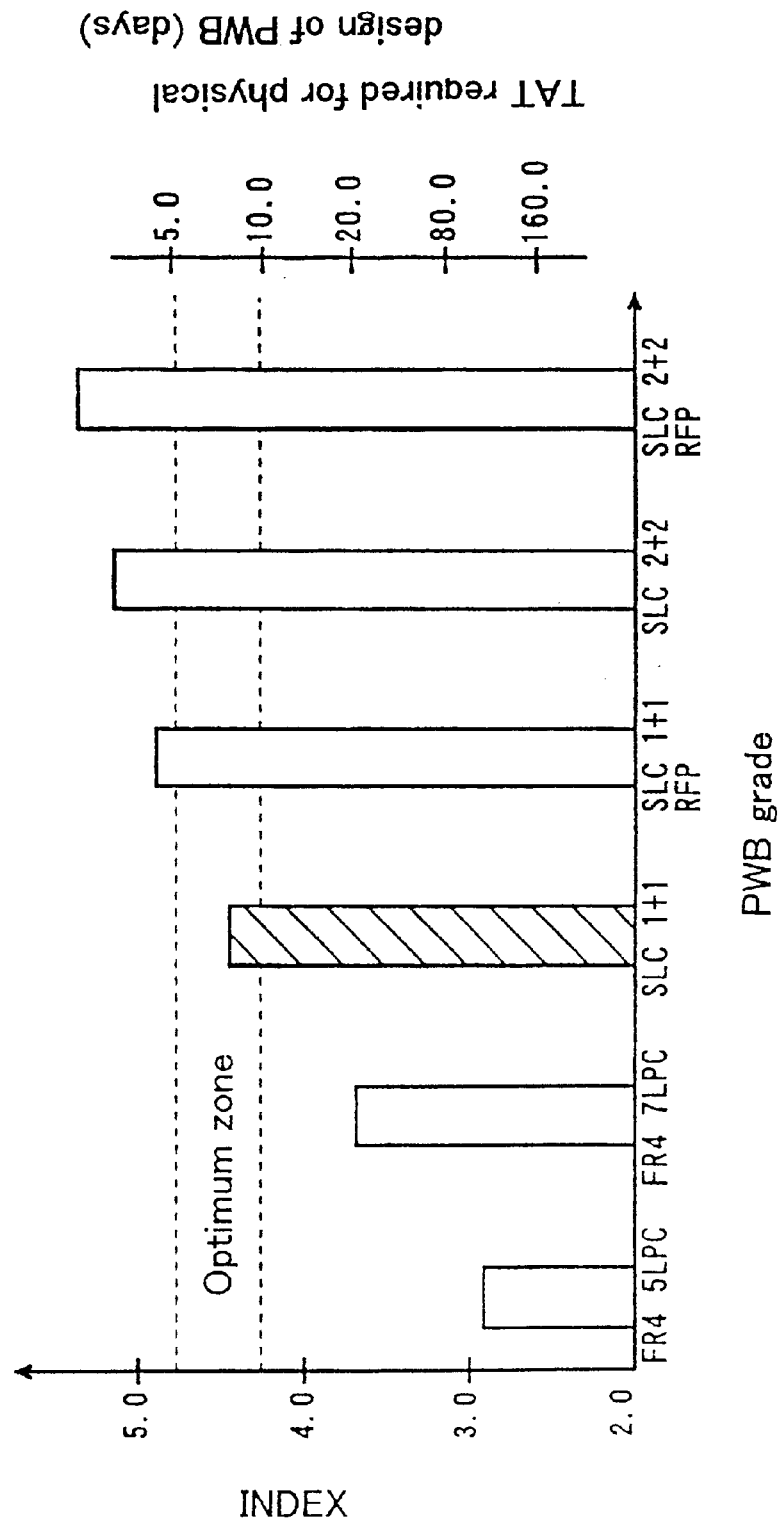
FIG. 2 is a diagram showing an example of a relationship between a PWB grade of a board, an INDEX, and a TAT (Turn Around Time).

FIG. 2 shows an example of a relationship between a PWB (printed wiring board) grade of a board and an INDEX. In FIG. 2, the PWB grade "FR4 5LPC" represents a glass cloth epoxy board on which five wiring conductors are formed in a space between lands having plated through holes (PTH), and the PWB grade "SLC 1+1 RFP" (SLC stands for Surface Laminate Circuit) represents a board which has one build-up layer on each side of the board and in which the PTHs are filled with resin so that wiring patterns can be formed on the filled parts. Since the wiring density increases with the grade of the board, the total wirable length in the formula (1) above increases with the grade of the board and consequently the INDEX values increase. Furthermore, a degree of flexibility in wiring increases with the INDEX value, which leads to the reduction of overflow of automatic wiring carried out by calculation performed by the PWB designing apparatus, and makes a TAT (e.g., the number of required design days) shorter. The overflow herein indicates the number of wires which cannot be formed by automatic wiring. Since the wires which cannot be formed by automatic wiring must be formed on the board manually by an engineer, the number of manually-formed wires increases with the overflow, which causes a corresponding exponential increase of TAT.

Thus, there is a correlation between a board and an INDEX, and there is also a correlation between an INDEX and a TAT. Such information regarding correlation between an INDEX and a TAT is stored as a TAT information in the storage section 38 (FIG. 1) in advance. This TAT information is prepared on the basis of the data of printed wiring boards designed in the past. Therefore, an INDEX value (range) is selected from the TAT information in accordance with a desired TAT and stored in the storage section 38 as INDEX information. For example, if a printed wiring board is desired to be designed in 5 to 10 days, the range of INDEX values (4.25 to 4.75) corresponding to 5 to 10 days is selected from the TAT information and the values within this range (4.25 and 4.75) are stored in storage section 38. Then, the INDEX values of the various boards are determined, and a board having an INDEX value within the above-mentioned range is selected. Thus, a board which is wirable and can be designed at a low cost can be selected.

Figure 3:
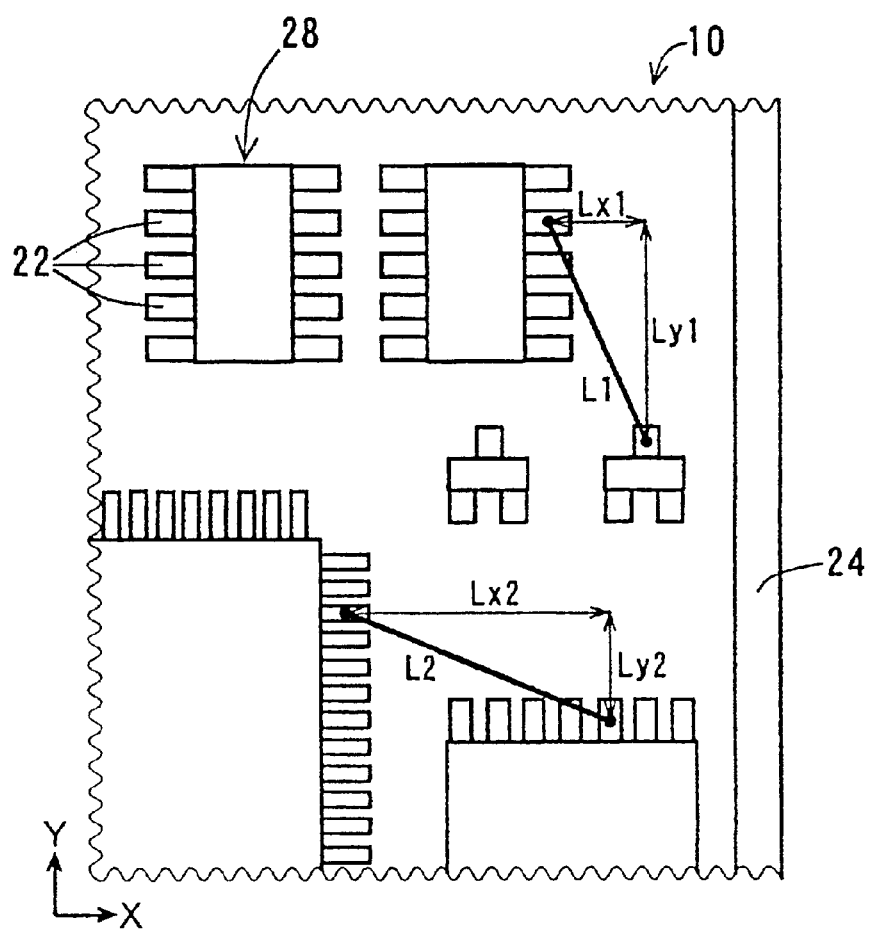
FIG. 3 is a diagram showing an example of the unwirable area of the board including an outer edge of the board and the pad portions, and it is also an diagram showing an example of the minimum wiring length (Manhattan Length) between components.
Figure 4A:
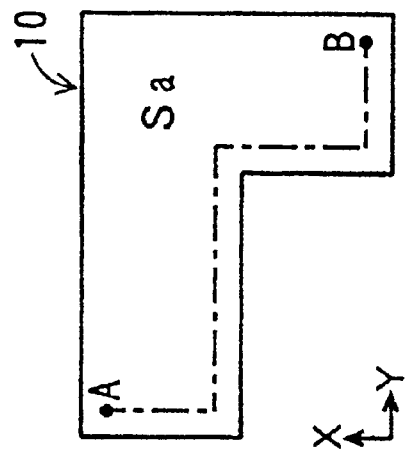
FIGS. 4(a) to 4(d) are diagrams showing an area of the board.
Figure 4B:
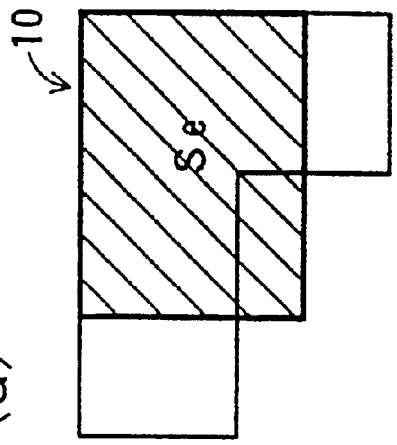
Figure 4C:
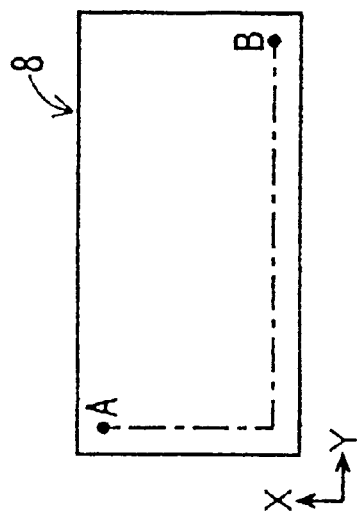
Figure 4D:
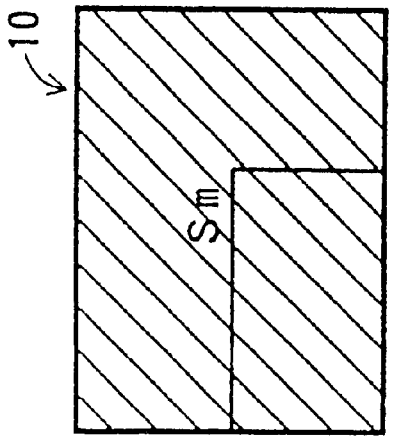

The sum of the minimum wiring lengths (Manhattan lengths) is used as the total wiring length in the formula (1). As shown in FIG. 3, minimum wiring lengths are not the actual minimum routes (L1, L2), but the minimum routes (Lx1+Ly1, Lx2+Ly2) represented by the sum of the routes in two directions (X direction and Y direction) perpendicular to each other. These minimum wiring lengths (Manhattan lengths) are calculated from connection information.

$$\text{(Total Wiring Length)} = (\text{Sum of minimum wiring lengths}) = (Lx1 + Ly1) + (Lx2 + Ly2) + \ldots + (Lxn + Lxn) \quad (2)$$

The total wirable length in the formula (1) provided above is calculated from a wirable area of the board, and the wirable area of the board is calculated from all the wiring layers of the board. In order to form wiring patterns on the board, uniformly-spaced reference lines intersecting each other at right angles are drawn on the board. These reference lines are generally called a grid and the minimum wiring space is regarded as a grid space. Thus, the total wirable length can be calculated from the wirable area of the board and the grid space.

$$\text{(Total Wirable Length)} = (\text{Wirable Area of the Board})/(\text{Grid Space}) \quad (3)$$

The wirable area of the board in the formula (3) immediately above can be calculated from the area of the board and the unwirable area of the board.

$$\text{(Wirable Area of the Board)} = (\text{Area of the Board}) - (\text{Unwirable Area}) \quad (4)$$

The area of the board in this 4th formula can be calculated from the board information. However, when a rectangular board 8 shown in FIG. 4(*a*) and an L shaped board 10 shown in FIG. 4(*b*) are equal in area, the board 8 has a higher degree of flexibility in wiring than the board 10 as shown by a dotted line between points A and B in FIGS. 4(*a*) and 4(*b*). Thus, a degree of flexibility in wiring varies depending on the shape of the board, which means that the difference in the shape of the board can introduce an error to the INDEX value.

In this embodiment, a virtual effective board area is used as the area of the board in the formula (4) in consideration of the figure of the board. The effective board area is calculated from the actual board area Sa (FIG. 4(*b*)) and the virtual maximum board area Sm (FIG. 4(*c*)). Specifically, a correction factor k is calculated from the actual board area Sa and the virtual maximum board area Sm as follows:

$$k = Sa/Sm$$

The effective board area Se is calculated from this correction factor k and the actual board area Sa as follows:

$$Se = k \times Sa$$

The virtual maximum board area Sm is the area of a rectangle on the basis of the outermost edge of the board. For this reason, the correction factor k increases within the range of 0<k<1 as the shape of the actual board area becomes more and more like a rectangle.

With this correction, the virtual board area (the effective board area Se) can be determined in consideration of the configuration of the board, as shown in FIG. 4(*d*). The effective board area is smaller than the actual board area Sa which includes the area having the low degree of flexibility in wiring. Such a correction of the actual board area (Sa) can reduce errors of the INDEX resulting from the variation of the degree of flexibility in wiring due to the difference in the configuration of the board.

The unwirable area in the 4th formula above is the sum of the areas of unwirable potions, on which wiring patterns cannot be formed, such as outer edge portions of the board, assembly holes, conducting pads, pin holes, via holes, and the like. As shown in FIG. 3, the outer edge portion 24 of the board is an unwirable area of the board. The assembly hole is a hole for securing the board with a screw. The conductive pads are terminal pads for connecting leads 22 of a component 28 to the board. The pin holes are holes for inserting pins of the component, and the via hole is a hole for interlayer connection. In this specification, the areas of these holes include land areas around these holes, if these are drilled in the lands.

The area of the outer edge portion of the board, the area and the number of the assembly holes can be obtained from the board information. The areas of the pads, and the areas and the number of the pin holes can be obtained from the component information. However, a via hole count is not determined before wiring patterns are formed on the board. For this reason, it is assumed that the total area of the via holes cannot be obtained until wiring patterns are formed on the board.

In the PWB designing apparatus and method of the present invention, a via hole count is estimated prior to the formation of wiring patterns. Specifically, the via hole count is estimated on the basis of the PWB grade and a signal count and a power count of the components, as shown in FIG. 5. Information necessary to estimate such a via hole count is input into the storage section 38 as via count estimation information in advance. This via hole count estimation information is prepared on the basis of the data of printed wiring boards designed in the past. In FIG. 5, the PWB grade "SLC (1+1on 4S2P)" is an FR4 board (glass epoxy board) of 4S2P (4 signal layers and 2 power layers) having one build-up layer on each side thereof. The via hole count is the sum of the PTH (plated through hole) count and the photo via count. The "FV 1/BV 1" for forming photo vias represents a first build-up layer formed on the FR4 board, and "FV2/BV2" represents the second build-up layer formed on the first layer.

Such means of estimating a via hole count on the basis of a PWB grade, a signal count and a power count of the components enables the determination of the via hole count prior to the formation of wiring patterns on the board. The size of the via hole is determined by the PWB grade, and the unwirable area can be calculated by determining the total area of via holes on the basis of the obtained via hole count. Thus, the INDEX values of various boards can be determined before wiring patterns are formed on the board.

The wiring layers on the whole printed wiring board include signal layers and power layers, so that the determined via hole count can be corrected in accordance with the number of signal layers. Specifically, as shown in FIG. 6, the correction factor is determined in accordance with the number of signal layers, and the determined via hole count is corrected by multiplying the via hole count by this correction factor. Information necessary to correct the via hole count is input into the storage section 38 as via count correction information in advance. The via count correction information is prepared on the basis of the data of printed wiring boards designed in the past. Such means of correcting the via hole count in accordance with the number of signal layers enables more accurate estimation of the via hole count, so that the total area of the via holes can be determined more accurately.

Figure 7A:
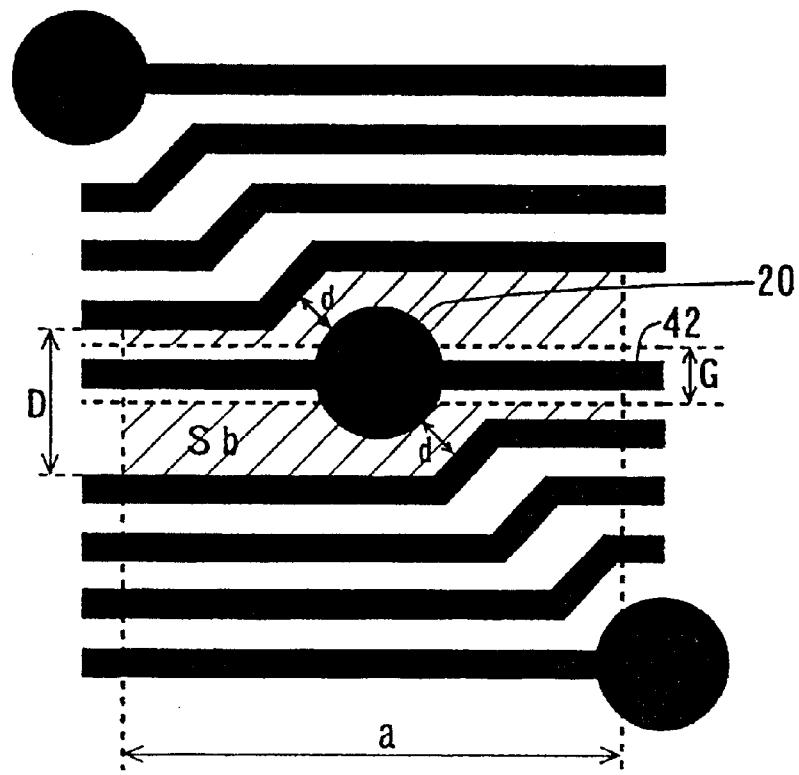
FIGS. 7(a) and 7(b) each are a diagram showing a wiring-inhibited area resulting from the formation of holes.
Figure 7B:
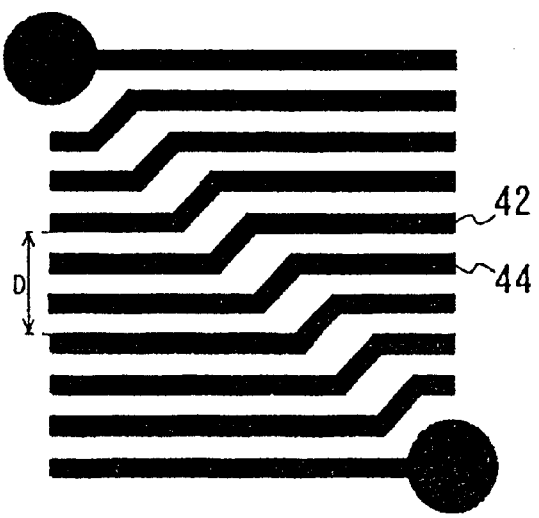

Further, in the PWB designing apparatus and method of the present invention, an unwirable area Sb is determined in consideration of via holes, lands, and wiring-inhibited area resulting from forming the via holes and the lands 20, as shown in FIG. 7(*a*). FIG. 7(*a*) shows the wiring-inhibited area resulting from the formation of the via holes and the lands 20. The length a is parallel to a wiring conductor 42 that passes through a via hole and the land 20 (in the center 10 in FIG. 7 (*a*)), and the value of the length is preset on the basis of the data of printed wiring boards designed in the past. Assuming that the diameter of the land 20 is R, the space between the land 20 and a wiring is d, and a grid space which is a reference for wiring is G, an unwirable area Sb resulting from the formation of a via hole and the land 20 can be represented as follows:

$$Sb = (D-G) \times a. \quad (5)$$

In the above formula (5), D can be represented as follows: $D = (R+2d)/\sqrt{2}$
wherein $\sqrt{n}$ represents the root of n. The area determined by $D \times a$ corresponds to the area between the wirings which sandwich the via hole and the central land 20, and the area determined by $G \times a$ corresponds to the area of the wiring that passes through the via hole and the land 20. The area Sb represents an area of a wiring 44 that could be drawn (utilized) if the via hole and the land 20 were not formed, as shown in FIG. 7(*b*). The value of a is preset to a certain value, for example 2.54 [mm], which represents the length parallel to the wiring 42 that passes through the via hole and the land 20 in the unwirable area resulting from the formation of one via and land 20.

Thus, the unwirable area resulting from the formation of the hole and the land can be determined more accurately by determining not only the area of the hole and the land but also the wiring-inhibited area resulting from the formation of the hole and the land. This makes it possible to determine the wirable area of the board more accurately.

Figure 8:
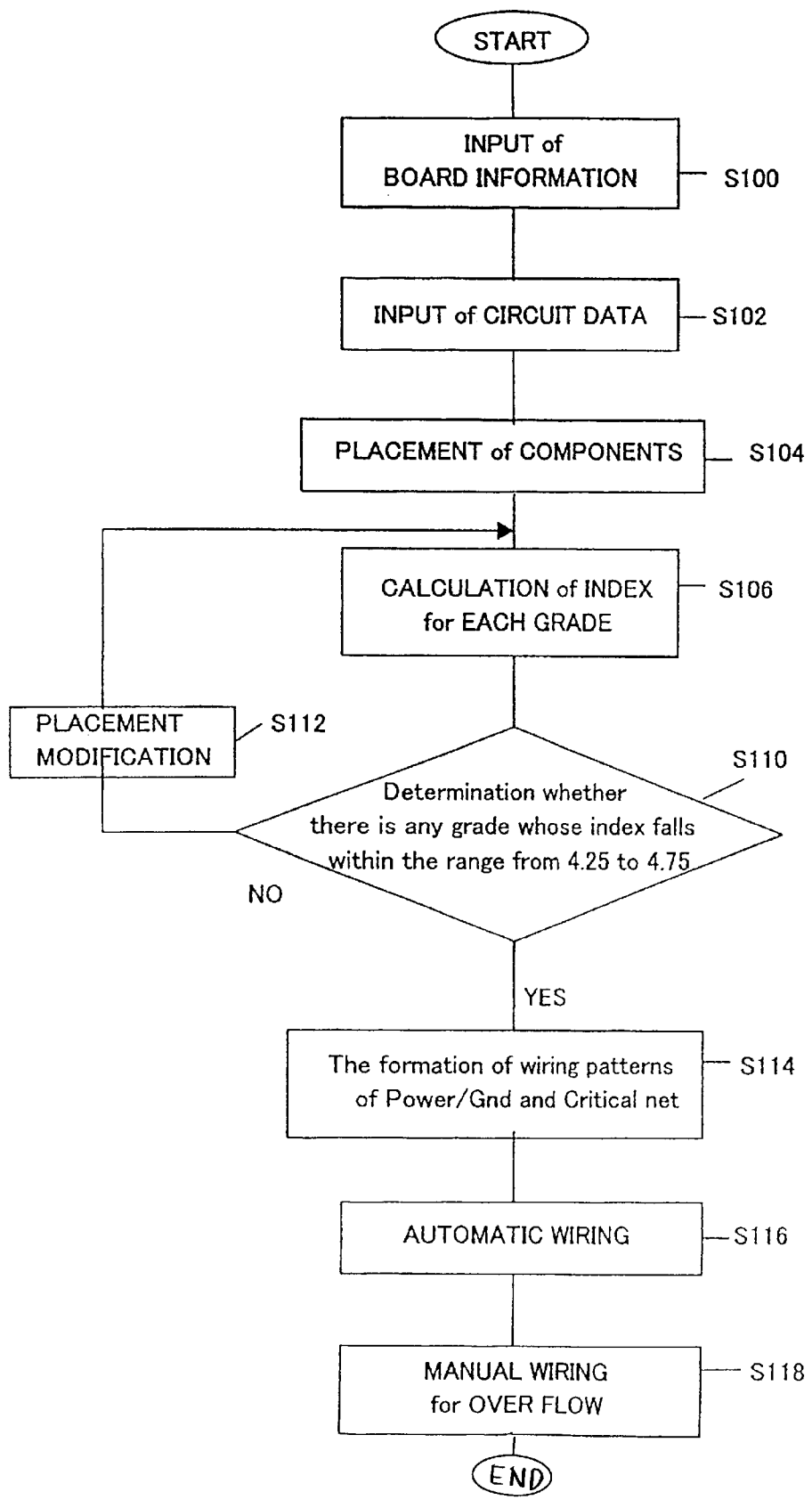
FIG. 8 is a diagram showing an example of a series of steps for designing a board according to the present invention.

FIG. 8 shows a series of steps for designing a printed wiring board by using the PWB designing apparatus of the present invention. A desired range of 4.25 to 4.75 is set as the INDEX information. As stated, this range varies depending on the desired TAT. In this embodiment, an INDEX value (range) which is in the TAT range of 5 to 10 days is selected in accordance with the TAT information shown in FIG. 2. Board information is input (S 100), and then component information, connection information, and a logic circuit that connects the components are input (S 102). The board information, for example, includes information on six grades of the boards, as shown in FIG. 2. Then the components are placed (S 104), and the INDEX for each grade is calculated (S 106). The calculation result of INDEX for each grade is shown in FIG. 2.

Whether there is any grade whose INDEX falls within the predetermined range (4.25 to 4.75) or not is then determined (S 110). If there is no grade whose INDEX falls within the predetermined range, the placement of the components is changed (S 112) and the INDEX is determined again (S 106). On the other hand, if there is a grade whose INDEX falls within the predetermined range, a board of the grade is selected. In the example shown in FIG. 2, the board of "SLC 1+1" is selected because this board clearly falls within the optimum zone, while the five other boards lie outside said zone. If there are a plurality of grades whose INDEXs fall within the predetermined range, a board of lower grade can be selected, provided cost is a significant factor, and a board of higher grade can be selected if the TAT is important. When the grade of the board is determined, wiring patterns of a power line (POWER), a ground line (Gnd), and a critical net such as a high frequency line, high current line, and a bus line (S 114) whose signal quality should be maintained high are designed. After that, automatic wiring is carried out (S 116), and the wirings which cannot be formed by automatic wirings are manually formed on the board (S 118).

Figure 9:
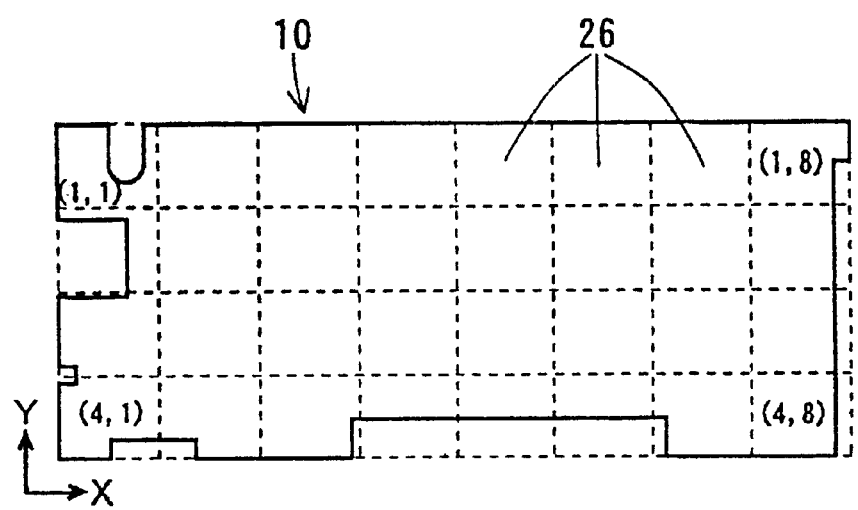
FIG. 9 is a diagram showing a board sectioned into a plurality of regions.

Further, an INDEX of the whole board can be determined by determining an INDEX for each of the board's regions (i.e., 1,1; 1,8; 4,1; and 4,8 as seen in FIG. 9) and calculating an average thereof. A parameter necessary to determine each INDEX is determined for each region. If the parameter cannot be determined for each region, the parameters of the region are determined in accordance with the ratio of the signal count and the power count of the region relative to the signal counts and the power counts of all the regions. For example, the via hole count of the region (1,1) is determined by the following formula:

(via hole count of all the regions)×[(signal count and power count of the region (1,1))/(signal count and power count of all the regions)]

The determination of the INDEX for each region can improve the efficiency of placement modification (S 112), manual wiring (S 118), and the like. For example, an excessively small INDEX of a specific region means that the formation of wiring patterns is concentrated in that region. In this case, some of the components in that region are moved to other regions to disperse the wiring patterns, and thereby the INDEX of that region becomes closer to the average. Furthermore, the automatic wiring can be carried out after the manual wiring is performed in that region. Thus, the determination of the INDEX for each sectioned region makes it easier to cope with local problems on the board.

Embodiments of the PWB designing method and apparatus of the present invention have been described so far with reference to the accompanying drawings, but the present invention is not limited to the above-described embodiments. For example, if the grade of the board has been already determined, the method and the apparatus of the present invention can be used as a means of estimating the TAT. The present invention is intended to embrace various modifications, alternations and changes made on the basis of knowledge of those skilled in the art without departing from the scope of the invention as defined by the appended claims.

What is claimed is:

1. An apparatus for designing a printed wiring board wherein information on electrical components to be mounted on the board, information on connection between said components, and a grade of the board is selected, said apparatus comprising:
    means for determining an actual board area for said printed wiring board;
    means for determining an unwirable area of said board; and
    means for determining an INDEX value for said board wherein said INDEX value comprises a ratio of a total wirable length for said board based on a wirable area of said board obtained by subtracting said determined unwirable area from said determined actual board area to a wiring length connecting said components mounted/placed on said board.

2. The apparatus for designing a printed wiring board according to claim 1, comprising:
    means for storing information on a correlation between said INDEX value and a TAT required for designing said printed wiring board;
    means for storing an INDEX value range corresponding to the TAT desired on the basis of said correlation; and
    means for determining whether there is any grade value whose INDEX falls within said INDEX range corresponding to said desired TAT.

3. The apparatus for designing a printed wiring board according to claim 1, wherein said means for determining said unwirable area includes means of estimating a via hole count to be formed on said board on the basis of said grade of said board, a signal count, and a power count.

4. The apparatus for designing a printed wiring board according to claim 3, wherein said means of estimating said via hole count includes means for correcting said estimated via hole count on the basis of the number of signal layers desired for said board.

5. The apparatus for designing a printed wiring board according to claim 3, wherein said unwirable area includes a wiring-inhibited area resulting from the formation of at least one via hole and at least one land.

6. The apparatus for designing a printed wiring board according to claim 1, wherein said board is sectioned into a plurality of regions and said INDEX value is determined by taking an average index value of each sectioned region.

7. The apparatus for designing a printed wiring board according to claim 1, wherein said apparatus includes means for considering the outermost edge area of said board which is not used for wiring or having said components positioned thereon.

8. A method for designing a printed wiring board wherein information on electrical components to be mounted on the board, information on connection between the components, and a grade of the board is selected, said method comprising the steps of:
    determining an actual board area;
    determining an unwirable area of said board; and
    determining an INDEX value for said board wherein said INDEX value comprises a ratio of a total wirable length for said board based on a wirable area of said board obtained by subtracting said determined unwirable area from said determined actual board area to a wiring length connecting said electrical components mounted/placed on said board.

9. The method for designing a printed wiring board according to claim 8, further comprising the steps of:

selecting an acceptable INDEX range of values corresponding to a desired TAT required for designing a printed wiring board on the basis of correlation between said TAT and said INDEX value; and selecting a grade of the board whose INDEX value falls within said acceptable INDEX range corresponding to said desired TAT.

10. The method for designing a printed wiring board according to claim 8, wherein said step of determining said unwirable area includes estimating a via hole count to be formed on said board on the basis of said grade of said board, a signal count, and a power count.

11. The method for designing a printed wiring board according to claim 10, wherein said step of estimating said via hole count includes correcting said estimated via hole count on the basis of the number of signal layers desired for said board.

12. The method for designing a printed wiring board according to claim 8, further comprising the steps of:

sectioning said board into a plurality of regions each having an INDEX value; and determining the INDEX value for said printed wiring board based on an average of said INDEX values for said regions.

13. An apparatus for designing a printed wiring board wherein information on electrical components to be mounted on the board, information on connection between said components, and a grade of the board is selected, said apparatus comprising:

means for determining an actual board area for said printed wiring board;

means for determining an unwirable area of said board;

means for determining an INDEX value for said board wherein said INDEX value comprises a ratio of a total wirable length for said board based on a wirable area of said board obtained by subtracting said determined unwirable area from said determined actual board area to a wiring length connecting said components mounted/placed on said board, and wherein said means for determining said unwirable area includes means of estimating a via hole count to be formed on said board on the basis of said grade of said board, a signal count, and a power count, and wherein said unwirable area includes a wiring-inhibited area resulting from the formation of at least one via hole and at least one land, and wherein said wiring-inhibited area is determined by multiplying a predetermined length parallel to a wiring passing through said at least one via hole and said at least one land by a distance between the wirings of said board which sandwich said at least one via hole and said at least one land.

14. The apparatus for designing a printed wiring board according to claim 13, wherein said wiring-inhibited area is determined by subtracting an area determined by multiplying said predetermined length parallel to said wiring passing through at least one via hole and said at least one land by a length corresponding to a width of said wiring passing through said at least one via hole and said at least one land from said area determined by multiplication.

15. A method for designing a printed wiring board wherein information on electrical components to be mounted on the board, information on connection between the components, and a grade of the board is selected, said method comprising the steps of:

determining an actual board area;

determining an unwirable area of said board; and determining an INDEX value for said board wherein said INDEX value comprises a ratio of total wirable length for said board based on a wirable area of said board obtained by subtracting said determined unwirable area from said determined actual board area to a wiring length connecting said electrical components mounted/placed on said board, and wherein said step of determining said unwirable area includes estimating a via hole count to be formed on said board on the basis of said grade of said board, a signal count, and a power count, and wherein said step of determining said unwirable area comprises:

determining a length between wirings which sandwich said at least one via hole and said at least one land;

multiplying a predetermined length parallel to a wiring passing through said at least one via hole and said at least one land by said determined length; and determining a wiring-inhibited area for said board by giving consideration to said at least one via hole and said at least one land.

16. The method for designing a printed wiring board according to claim 15, wherein said step of determining said wiring-inhibited area includes:

determining a wiring area for said board by multiplying a predetermined length parallel to a wiring passing through said at least one via hole and said at least one land by a length corresponding to said width of said wiring passing through said at least one via hole and said at least one land; and subtracting said wiring area from said wiring-inhibited area.

17. A method for designing a printed wiring board wherein information on electrical components to be mounted on the board, information on connection between the components, and a grade of the board is selected, said method comprising the steps of:

determining an actual board area;

determining an unwirable area of said board;

determining an INDEX value wherein said INDEX value comprises a ratio of a total wirable length for said board based on a wirable area of said board obtained by subtracting said determined unwirable area from said determined actual board area to a wiring length necessary to connect said electrical components to said board; and wherein said step of determining said area of said board includes:

determining a virtual maximum board area on the basis of an outermost edge of the board not used for wiring or having said components thereon;

determining a ratio of the actual board area to the determined virtual maximum board area; and multiplying said actual board area by said determined ratio.

* * * * *